United States Patent
Cheon et al.

(10) Patent No.: US 9,685,486 B2
(45) Date of Patent: Jun. 20, 2017

(54) ORGANIC LIGHT-EMITTING DIODE DISPLAY WITH COLOR FILTER LAYER

(71) Applicant: Apple Inc., Cupertino, CA (US)

(72) Inventors: Kwang Ohk Cheon, Sunnyvale, CA (US); Rui Liu, San Jose, CA (US); Cheng Chen, San Jose, CA (US)

(73) Assignee: Apple Inc., Cupertino, CA (US)

( * ) Notice: Subject to any disclaimer, the term of this patent is extended or adjusted under 35 U.S.C. 154(b) by 23 days.

(21) Appl. No.: 14/862,006

(22) Filed: Sep. 22, 2015

(65) Prior Publication Data

US 2016/0322427 A1   Nov. 3, 2016

Related U.S. Application Data

(60) Provisional application No. 62/153,882, filed on Apr. 28, 2015.

(51) Int. Cl.
   *H01L 27/32* (2006.01)
   *H01L 51/52* (2006.01)

(52) U.S. Cl.
   CPC ........ *H01L 27/322* (2013.01); *H01L 27/3211* (2013.01); *H01L 51/5262* (2013.01); *H01L 51/5253* (2013.01); *H01L 51/5265* (2013.01)

(58) Field of Classification Search
   CPC ............. H01L 51/0545; H01L 51/0036; H01L 51/0541; H01L 51/5012
   See application file for complete search history.

(56) References Cited

U.S. PATENT DOCUMENTS

| | | | |
|---|---|---|---|
| 7,839,081 B2 * | 11/2010 | Kubota | H01L 27/3244 313/501 |
| 8,044,577 B2 | 10/2011 | Hwang et al. | |
| 8,853,940 B2 | 10/2014 | Satake | |
| 8,946,735 B2 | 2/2015 | Lee et al. | |
| 8,957,579 B2 | 2/2015 | Weaver et al. | |
| 2005/0275343 A1 * | 12/2005 | Tanaka | H01L 51/5268 313/504 |
| 2007/0096632 A1 | 5/2007 | Chin et al. | |

* cited by examiner

*Primary Examiner* — Quoc Hoang
(74) *Attorney, Agent, or Firm* — Treyz Law Group, P.C.; G. Victor Treyz; Zachary D. Hadd

(57) ABSTRACT

A display may have an array of pixels formed from organic light-emitting diodes of different colors. Each organic light-emitting diode may have an anode, a cathode, and an emissive layer between the anode and cathode. To prevent undesired color shifts with off-axis viewing angles, evaporated color filters may be formed on the cathode in alignment with the light-emitting diodes. The color filters may include red color filters that overlap the red diodes but not the green and blue diodes, may include red, blue, and green filters that overlap respective red, green, and blue diodes, or may include an orange filter that overlaps red and green diodes and a blue filter that overlaps blue diodes. The color filters may serve as a capping layer for the diodes or a capping layer that is separate from the color filters can be incorporated into the display.

13 Claims, 10 Drawing Sheets

ORGANIC LIGHT-EMITTING DIODE DISPLAY WITH COLOR FILTER LAYER

This application claims the benefit of provisional patent application No. 62/153,882 filed on Apr. 28, 2015, which is hereby incorporated by reference herein in its entirety.

BACKGROUND

This relates generally to electronic devices with displays, and, more particularly, to color displays such as color organic light-emitting diode displays.

Electronic devices often include displays. Displays such as organic light-emitting diode displays include arrays of pixels that emit light to display images for a user. The pixels of a display may include emissive material of different colors to provide the display with the ability to display color images.

It can be challenging to produce accurate color images with a display. Due to geometrical effects, the spectrum of each pixel's emitted light in an organic light-emitting diode display can exhibit undesired blue shifts at off-axis viewing angles. This non-ideal behavior can introduce undesired color shifts in the images on a display.

It would therefore be desirable to be able to provide improved displays for displaying color images such as improved organic light-emitting diode displays.

SUMMARY

A display may have an array of pixels on a substrate. The display may be an organic light-emitting diode display and the pixels may include organic light-emitting diodes of different colors. For example, the organic light-emitting diodes may include red organic light-emitting diodes, green organic light-emitting diodes, and blue organic light-emitting diodes.

Each organic light-emitting diode may have an anode, a cathode, and an emissive layer between the anode and cathode. To prevent undesired color shifts for off-axis viewing angles, evaporated color filters may be formed on the cathode in alignment with the light-emitting diodes. The color filters may block color-shifted off-axis light.

The color filters may include red color filters that overlap the red diodes but not the green and blue diodes, may include red, blue, and green filters that overlap respective red, green, and blue diodes, may include an orange filter that overlaps red and green diodes and a blue filter that overlaps blue diodes, or may include other color filter structures. The color filters may serve as a capping layer for the diodes or a capping layer that is separate from the color filters can be incorporated into the display.

DETAILED DESCRIPTION

Figure 1:
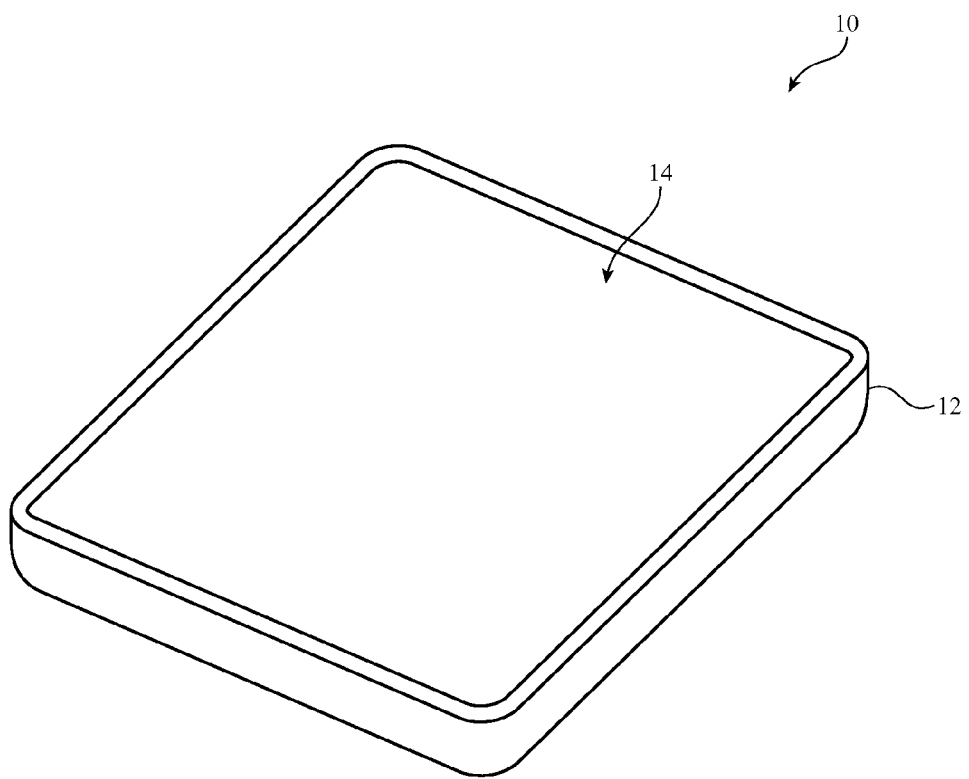
FIG. 1 is a perspective view of an illustrative electronic device having a display in accordance with an embodiment.

An illustrative electronic device of the type that may be provided with a display is shown in FIG. 1. Electronic device 10 may be a computing device such as a laptop computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a computer monitor or other display containing an embedded computer or other electronic equipment, a computer display or other monitor that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A touch sensor may be formed using electrodes or other structures on a display layer that contains a pixel array or on a separate touch panel layer that is attached to the pixel array (e.g., using adhesive).

Display 14 may include an array of pixels formed from liquid crystal display (LCD) components, an array of electrophoretic pixels, an array of plasma pixels, an array of organic light-emitting diode pixels or other light-emitting diodes, an array of electrowetting pixels, or pixels based on other display technologies. Configurations in which display 14 is an organic light-emitting diode display are sometimes described herein as an example. The use of organic light-emitting diode pixels to form display 14 is merely illustrative. Display 14 may, in general, be formed using any suitable type of pixels.

Display 14 may be protected using a display cover layer such as a layer of transparent glass or clear plastic. Openings may be formed in the display cover layer. For example, an opening may be formed in the display cover layer to accommodate a button, a speaker port, or other component. Openings may be formed in housing 12 to form communications ports (e.g., an audio jack port, a digital data port, etc.), to form openings for buttons, etc.

Figure 2:
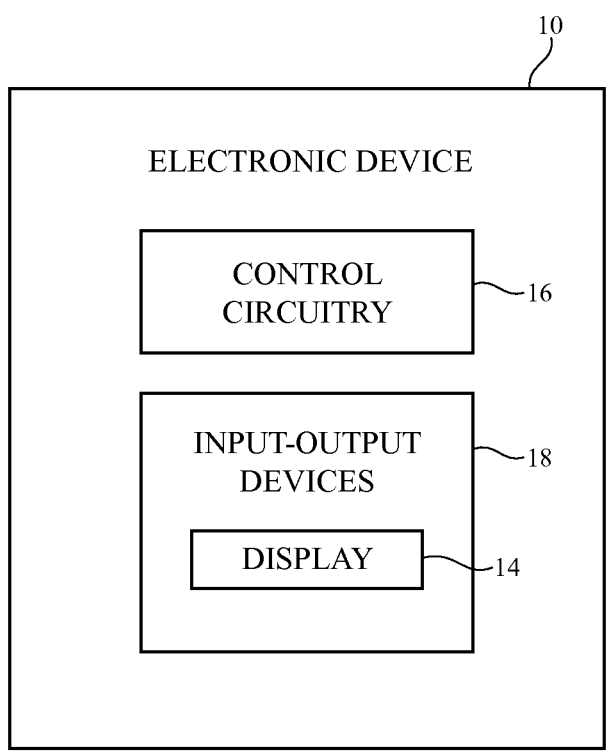
FIG. 2 is a schematic diagram of an illustrative electronic device having a display in accordance with an embodiment.

FIG. 2 is a schematic diagram of device 10. As shown in FIG. 2, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18. Input-output devices 18 may include one or more displays such as display 14.

Control circuitry 16 may be used to run software on device 10 such as operating system code and applications. During operation of device 10, the software running on control circuitry 16 may display images on display 14 using an array of pixels in display 14.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 3:
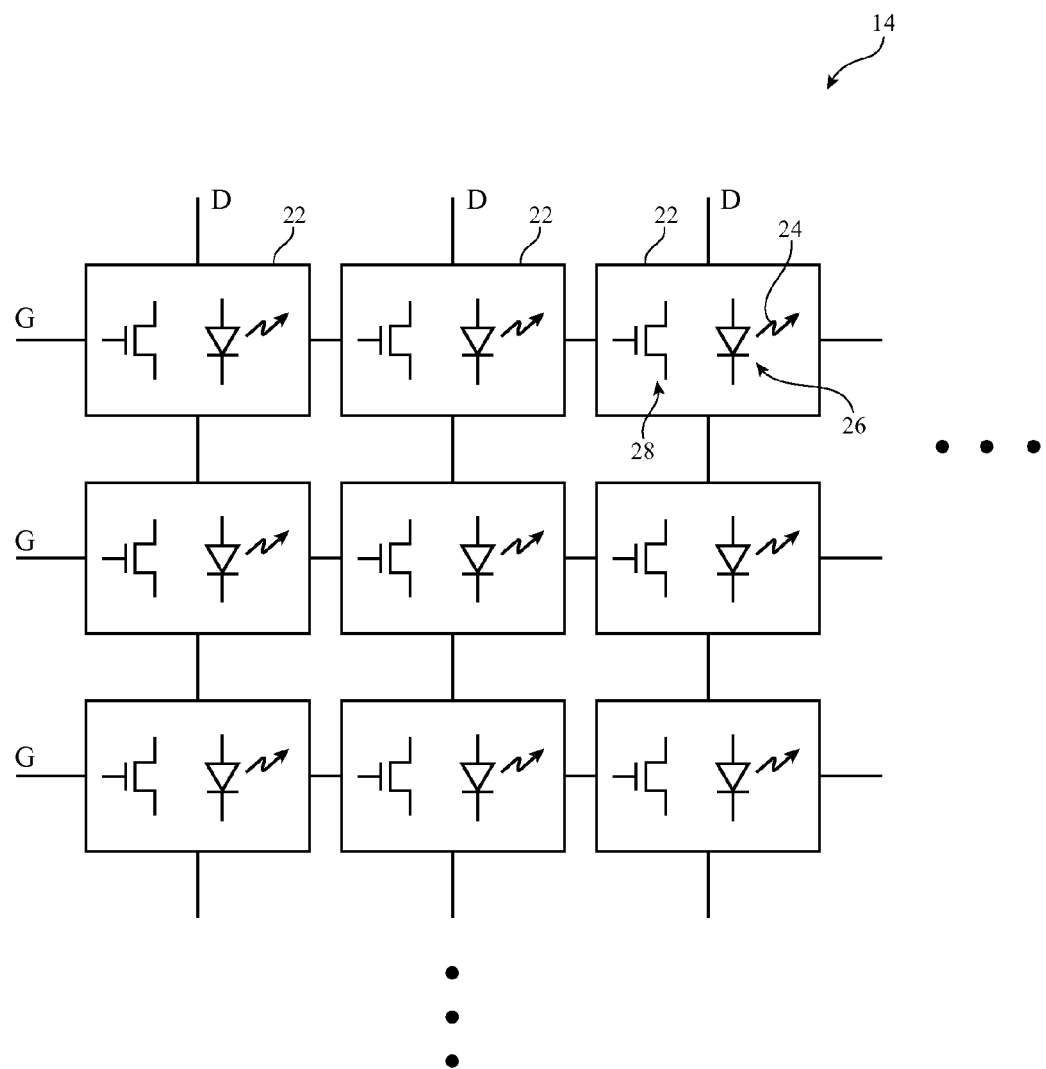
FIG. 3 is a top view of an illustrative display in an electronic device in accordance with an embodiment.

A top view of a portion of display 14 is shown in FIG. 3. As shown in FIG. 3, display 14 may have an array of pixels 22. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel control circuit formed from transistor circuitry such as thin-film transistors 28 and thin-film capacitors). Transistors 28 may be polysilicon thin-film transistors, semiconducting-oxide thin-film transistors such as indium gallium zinc oxide transistors, or transistors formed from other semiconductors.

Figure 4:
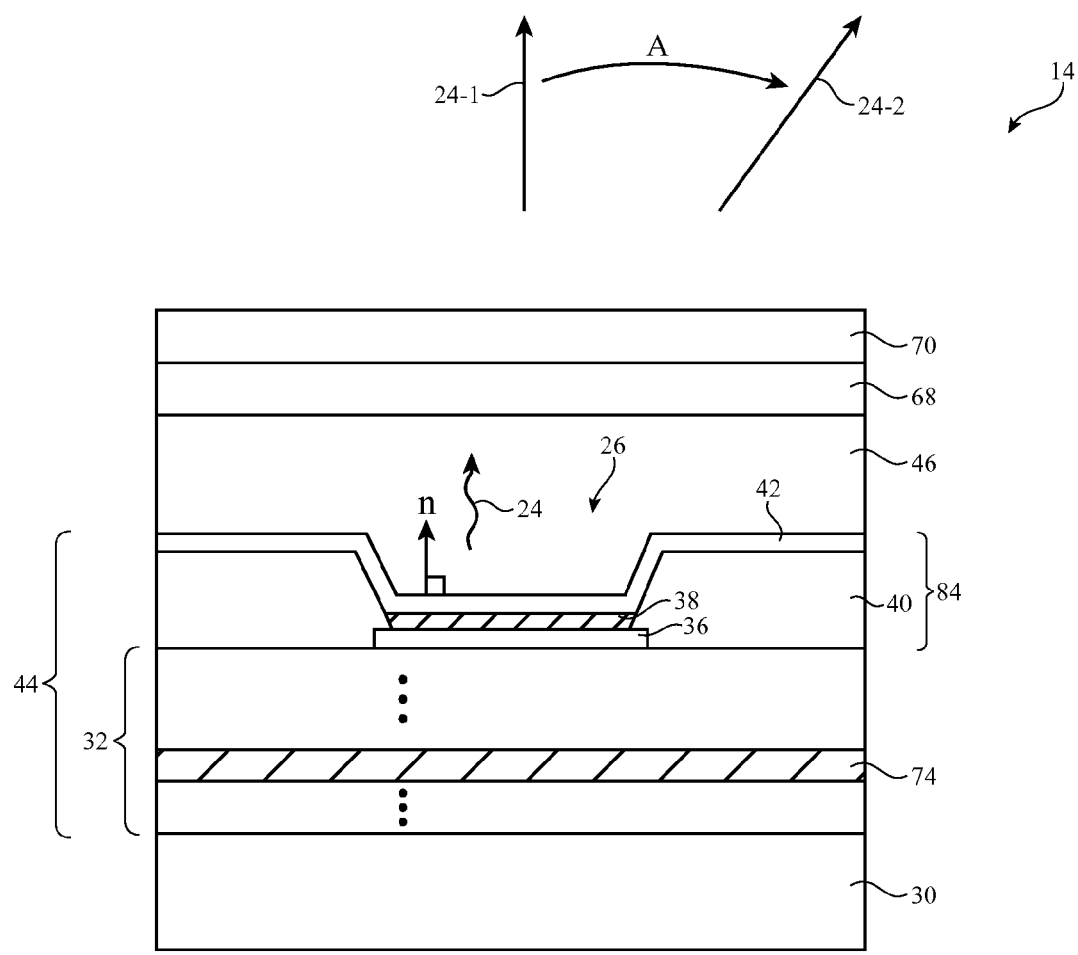
FIG. 4 is a cross-sectional side view of a portion of an illustrative organic light-emitting diode display in accordance with an embodiment.

A cross-sectional side view of a portion of an illustrative organic light-emitting diode display in the vicinity of one of light-emitting diodes 26 is shown in FIG. 4. As shown in FIG. 4, display 14 may include a substrate layer such as substrate layer 30. Substrate 30 may be formed from a polymer or other suitable materials.

Thin-film transistor circuitry 44 may be formed on substrate 30. Thin film transistor circuitry 44 may include layers 32. Layers 32 may include inorganic layers such as inorganic buffer layers, barrier layers (e.g., barrier layers to block moisture and impurities), gate insulator, passivation, interlayer dielectric, and other inorganic dielectric layers. Layers 32 may also include organic dielectric layers such as a polymer planarization layer. Metal layers and semiconductor layers may also be included within layers 32. For example, semiconductors such as silicon, semiconducting-oxide semiconductors, or other semiconductor materials may be used in forming semiconductor channel regions for thin-film transistors 28. Metal in layers 32 such as metal traces 74 may be used in forming transistor gate terminals, transistor source-drain terminals, capacitor electrodes, and metal interconnects.

As shown in FIG. 4, thin-film transistor circuitry 44 may include diode anode structures such as anode 36. Anode 36 may be formed from a layer of conductive material such as metal on the surface of layers 32 (e.g., on the surface of a planarization layer that covers underlying thin-film transistor structures). Light-emitting diode 26 may be formed within an opening in pixel definition layer 40. Pixel definition layer 40 may be formed from a patterned photoimageable polymer such as polyimide.

In each light-emitting diode, layers of organic material 38 may be interposed between a respective anode 36 and cathode 42. Anodes 36 may be patterned from a layer of metal (e.g., silver) and/or one or more other conductive layers such as a layer of indium tin oxide or other transparent conductive material. Cathode 42 may be formed from a common conductive layer that is deposited on top of pixel definition layer 40. Cathode 42 may be formed from a thin metal layer (e.g., a layer of metal such as a magnesium silver layer) and/or indium tin oxide or other transparent conductive material. Cathode 42 is preferably sufficiently transparent to allow light 24 to exit light emitting diode 26. During operation, light-emitting diode 26 may emit light 24 in on-axis directions such as on-axis direction 24-1 (i.e., a direction parallel to surface normal n of anode 36) and off-axis directions such as off-axis direction 24-2 (i.e., directions that are oriented at non-zero angles A with respect to surface normal n).

If desired, the anode of diode 26 may be formed from a blanket conductive layer and the cathode of diode 26 may be formed from a patterned conductive layer. The illustrative configuration of display 14 in which a transparent blanket cathode layer 42 covers diodes that have individually patterned anodes 36 allows light 24 to be emitted from the top of display 14 (i.e., display 14 in the example of FIG. 4 is a "top emission" organic light-emitting diode display). Display 14 may be implemented using a bottom emission configuration if desired. Layers such as layers 36, 38, and 42 are used in forming organic light-emitting diodes such as diode 26 of FIG. 4, so this portion of display 14 is sometimes referred to as an organic light-emitting diode layer (see, e.g., layer 84 of FIG. 4).

Metal interconnect structures may be used to interconnect transistors and other components in circuitry 44. Metal interconnect lines may also be used to route signals to capacitors, to data lines D and gate lines G, to contact pads (e.g., contact pads coupled to gate driver circuitry), and to other circuitry in display 14. As shown in FIG. 4, layers 32 may include one or more layers of patterned metal for forming interconnects such as metal traces 74 (e.g., traces 74 may be used in forming data lines D, gate lines G, power supply lines, clock signal lines, and other signal lines).

If desired, display 14 may have a protective outer display layer such as cover glass layer 70. The outer display layer may be formed from a material such as sapphire, glass, plastic, clear ceramic, or other transparent material. Protective layer 46 may cover cathode 42. Layer 46, which may sometimes be referred to as an encapsulation layer may include moisture barrier structures, encapsulant materials such as polymers, adhesive, and/or other materials to help protect thin-film transistor circuitry.

Functional layers 68 may be interposed between layer 46 and cover layer 70. Functional layers 68 may include a touch sensor layer, a circular polarizer layer, and other layers. A circular polarizer layer may help reduce light reflections from reflective structures such as anodes 36. A touch sensor layer may be formed from an array of capacitive touch sensor electrodes on a flexible polymer substrate. The touch sensor layer may be used to gather touch input from the fingers of a user, from a stylus, or from other external objects. Layers of optically clear adhesive may be used to attach cover glass layer 70 and functional layers 68 to underlying display layers such as layer 46, thin-film transistor circuitry 44, and substrate 30.

Organic layer 38 may include an organic emissive layer (e.g., a red emissive layer in red diodes 26 that emits red light, a green emissive layer in green diodes 26 that emits green light, and a blue emissive layer in blue diodes 26 that emits blue light, etc.). The emissive material may be a material such as a phosphorescent material or fluorescent material that emits light during diode operation. The emissive material in layer 38 may be sandwiched between additional diode layers such as hole injection layers, hole transport layers, electron injection layers, and electron transport layers. These layers of material in layer 38 and the structures of cathode layer 42 and anode layer 36 form an optical etalon that can give rise to undesired color shifts in emitted light 24 at off-axis light emission angles.

Figure 5:
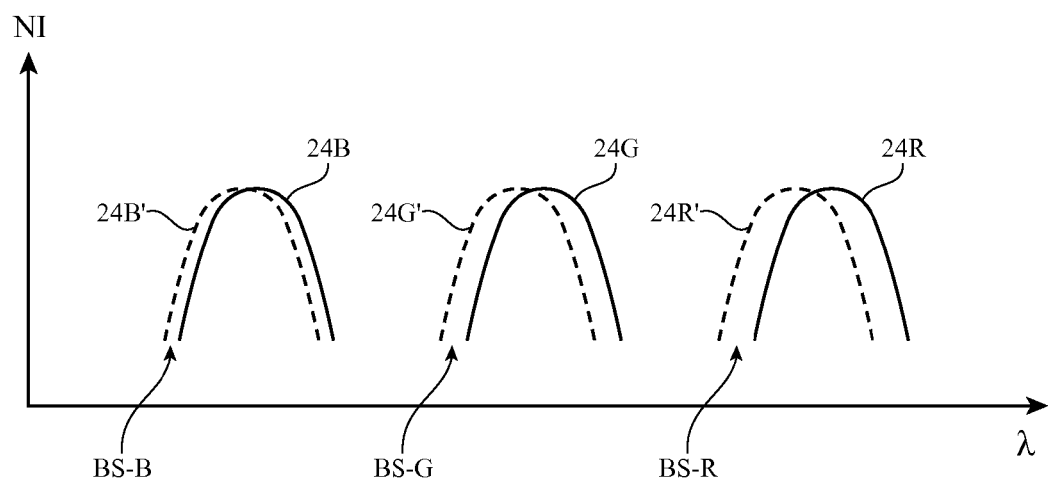
FIG. 5 is a graph showing how pixels in an organic light-emitting diode display may exhibit undesired color shifts as a function of light emission angle in accordance with an embodiment.

The dependence of the color spectrum of emitted light 24 on the angle of light emission in an illustrative organic light-emitting diode display shown in the graph of FIG. 5. In the graph of FIG. 5, normalized emitted light intensity NI has been plotted for light-emitting diodes of three colors. Curve 24R represents an illustrative light emission spectrum for the red light that is emitted from a red organic light-emitting diode at an angle A of 0° with respect to surface normal n (i.e., curve 24R corresponds to on-axis red light, which is emitted vertically in the orientation of FIG. 5). Emission spectra for green and blue on-axis light 24 from respective green and blue diodes 26 are given by curves 24G and 24B, respectively. At off-axis angles, the emitted light from the red, green, and blue diodes designs shifts towards blue wavelengths, an effect that tends to be most noticeable to human observers at longer wavelengths (e.g., red wavelengths). As shown in FIG. 5, the emission spectrum 24R' for off-axis red light 24 (i.e., light emitted at non-zero angle A with respect to surface normal n) includes blue-shifted red diode off-axis light BS-R. Off-axis light 24G' from the green diodes includes blue-shifted green diode off-axis light BS-G and off-axis light 24B' from the blue diodes includes blue-shifted blue diode off-axis light BS-B.

If care is not taken, the wavelength shifts represented by light BS-R, BS-G, and BS-B can lead to undesired color variations that adversely affect the quality of displayed images. To compensate for these potential color shifts, display 14 preferably contains color filter structures in the layers of display 14 above cathode 42. The color filter structures may include colored layers with transmission spectrums that block blue shifted light such as light BS-R for red diodes 26 in display 14, BS-G for green diodes 26 in display 14, and BS-B for blue diodes 26 in display 14 while passing light at wavelengths associated with unshifted curves 24R, 24G, and 24B, respectively. By blocking the wavelengths of light associated with off-axis color shifts, desired spectral shapes may be achieved for the red, green, and blue diodes 26 in display 14. The color filter structures may be formed from one or more evaporated organic layers or colored layers formed using other deposition techniques.

Evaporated color filter layers for display 14 may be formed from organic small molecules that are stable at the temperatures encountered during thermal evaporation operations.

The color filter layers may serve as a capping layer (see, e.g., protective layer 46 of FIG. 4) and/or may be used in combination with clear (non-colored) capping layer structures. A shadow mask may be used to accurately define the locations of the deposited color filter elements in each evaporated color filter layer. By avoiding misalignment between the evaporated color filter structures using the shadow mask, undesired effects such as color mixing effects can be avoided.

Figure 6:
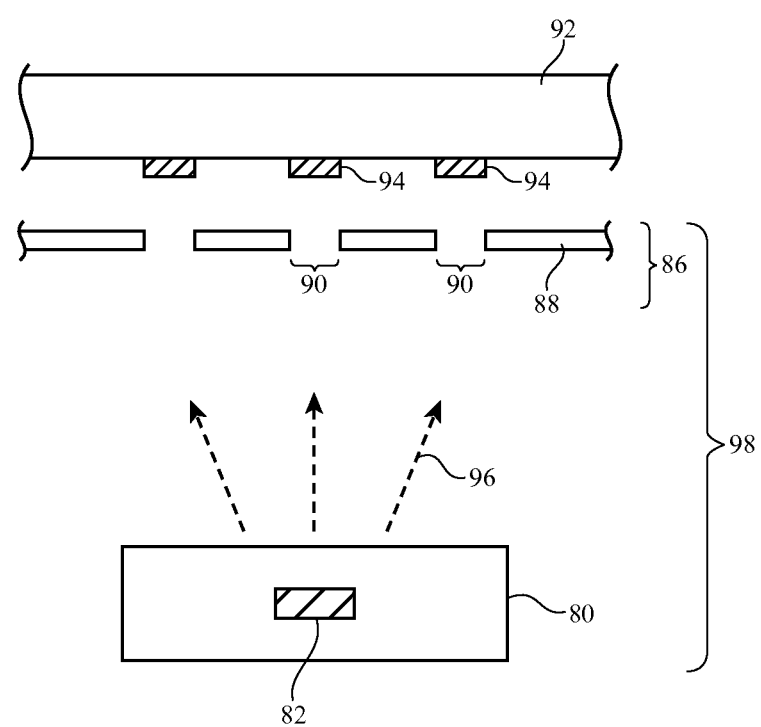
FIG. 6 is a cross-sectional side view of an illustrative organic light-emitting diode display layer being coated with an evaporated material that is patterned using a shadow mask in accordance with an embodiment.

An illustrative evaporation tool for depositing color filter layers in display 14 is shown in FIG. 6. As shown in FIG. 6, evaporation tool 98 includes a heating element such as heater 80 that heats a source of thermally evaporable color filter layer material such as source 82. When evaporated, the color filter material travels in directions 96 and passes through patterned pixel-shaped openings 90 in shadow mask 86. Shadow mask 86 may be formed from a thin layer of metal and may therefore sometimes be referred to as a fine metal mask.

The color filter material that passes through openings 90 is deposited onto the surface of display layer 92 to form patterned evaporated color filter layer 94. Display layer 92 may be a cathode layer such as a layer forming cathode 42 or other layer in display 14. The emissive layers and color filter layers and other patterned layers of diodes 26 may have an S-stripe pixel layout or other suitable layout (i.e., a layout in which pixels of different colors form columns, checkerboards, etc.). Layers such as layer 94 may be formed from materials such as organic small molecules and may be used in forming red, green, blue, orange, color filter layers (which may also serve as capping layers), color filter layers of other colors, clear capping layers, or other deposited layers for display 14.

Evaporation tool 98 may be used in depositing color filter and/or capping layers such as layer 94 and may be used in depositing layers 38 for display 14 (e.g., red emissive layers, green emissive layers, blue emissive layers, hole and electron transport and injection layers for pixels of different colors, etc.). Evaporated layers in display 14 such as illustrative layer 94 of FIG. 6 may be formed from small molecules (e.g., organic materials) that are thermally stable when evaporated. The materials that form the emissive layers for diodes 26 may contain diketopyrrolopyrrole dyes such as DCM2 (2-methyl-6-[2,3,6,7-tetrahydro-1H,5H-benjo(ij)quinolizine-9-yl)ethenyl]-4H-pyran-4-ylidene-]propan-dinitrile) and iridium complex materials. The materials that form the color filter layers for display 14 may contain diketopyrrolopyrrole dyes such as DCM (4-(dicyanomethylene)-2-methyl-6-(p-dimethylaminostyryl)-4H-pyran)) and DCM2 and pigments such as PR254 and PR256. Other materials that are thermally stable during evaporation may be evaporated onto display 14 using shadow masks such as mask 88 of FIG. 6 if desired (e.g., clear capping layers that are free of dyes and pigments).

The color filter layer can be formed form multiple materials (dye doped in a clear capping layer, multiple dyes evaporated at the same time from multiple dye sources, etc.).

Cross-sectional side views of four illustrative configurations for display 14 are shown in FIGS. 7, 8, 9, and 10.

Figure 7:
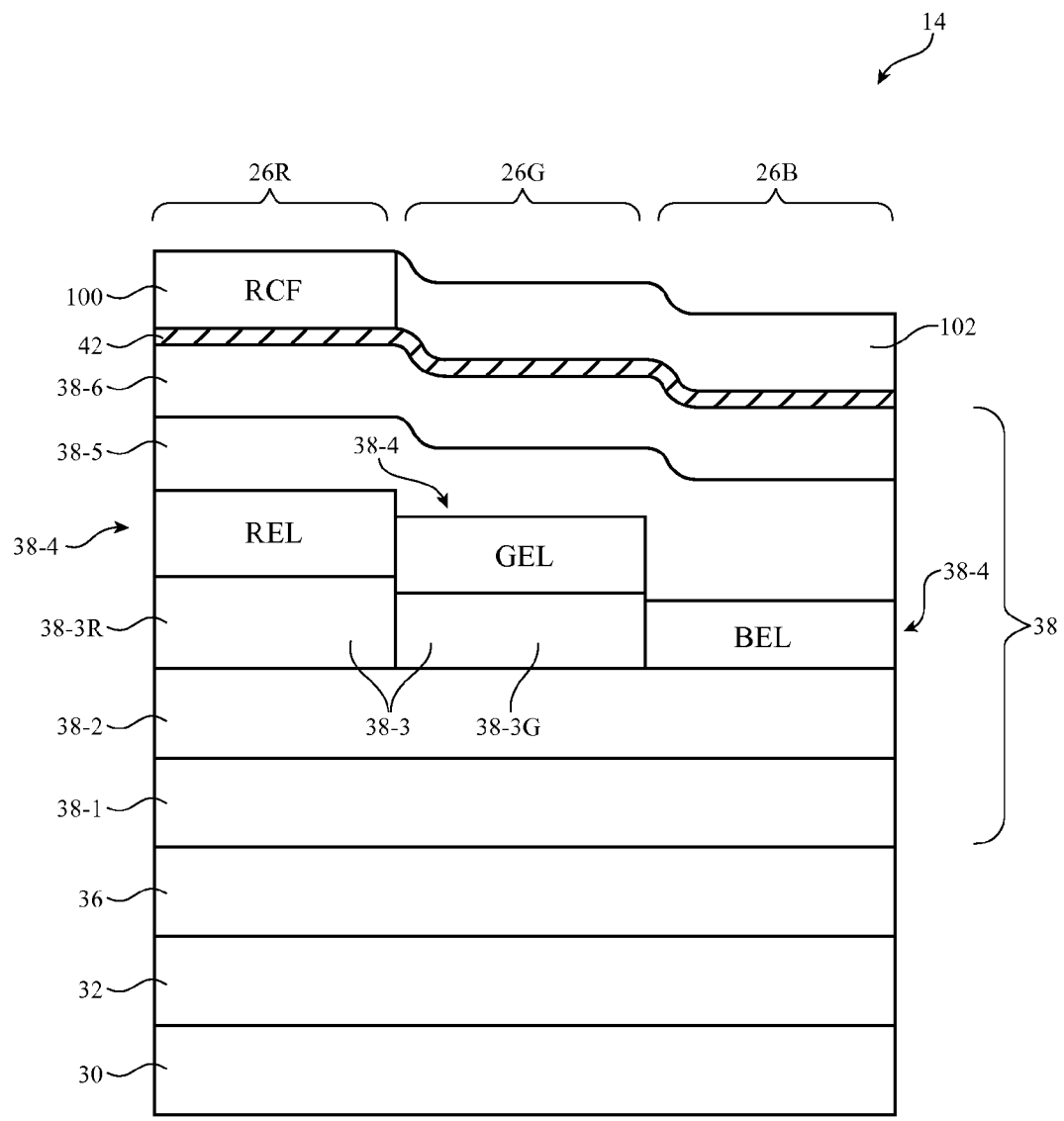
FIG. 7 is a cross-sectional side view of an illustrative organic light-emitting diode display in which red pixels are coated with an evaporated red color filter layer in accordance with an embodiment.

As shown in the example of FIG. 7, display 14 may include a substrate such as substrate 30 onto which layers 32 are formed, as described in connection with FIG. 4. Anode 36 (e.g., a silver/indium-tin-oxide layer or other suitable conductive layer) may be formed on layers 32. There may be a respective anode 36 for each subpixel in display 14 (i.e., each red pixel may have an anode, each green pixel may have an anode, and each blue pixel may have an anode and these anodes may be electrically isolated from each other to allow independent control).

Layers 38 may be formed on anode layer 36. Layers 38 may include hole injection layer 38-1 and hole transport layer 38-2. If desired, layer 38-3 may include hole transport layer materials for red pixels (red hole transport layer 38-R) and green pixels (green hole transport layer 38-G).

Emissive layer 38-4 may be formed over the hole transport layer. As shown in FIG. 7, emissive layer 38-4 may include red emissive layer REL for red diodes 26 in red pixels 22, green emissive layer GEL for green diodes 26 in green pixels 22, and blue emissive material BEL for blue diodes 26 in blue pixels 22. Layer 38-4 may also include emissive layers of other colors.

Electron transport layer 38-5 and electron injection layer 38-6 may be formed on top of the emissive material. Cathode layer 42 (e.g., a thin transparent magnesium silver cathode or other conductive transparent layer) may be formed on electronic injection layer 38-6.

In the illustrative configuration of FIG. 7, the portion of display 14 that is associated with red diode 26R has been covered with evaporated filter layer material 100 to form red color filter RCF. Filter RCF prevents blue-shifted red light BS-R from being emitted from diode 26R and may serve as a capping layer. Capping layer structures for display 14 (e.g., the capping layer formed by filter RCF in this example) serve environmental protection layers and are also formed with thicknesses appropriate to maximize light output (e.g., by adjusting diode etalon size and thereby tuning the etalon). In a display with diodes of multiple colors, the optimum etalon tuning for each color of diode may be different and the capping layer for each color of diode may, if desired, be different. In some configurations, a common capping layer may be used for multiple diodes (e.g., using an etalon thickness that maximizes blue light output). In the example of FIG. 7, green diode 26G and blue diode 26B may be covered with capping layer 102 (e.g., a clear capping layer deposited by evaporation). Capping layer 102 may have the same thickness as layer 100 or may have a different thickness to tune the etalons of the green and blue diodes differently than the red diode etalon. As an example, red color filter RCF may be formed from a layer that is about 50-70 nm thick and layer 102 may be 50-70 nm thick. The capping layer material of display 14 may have an index of refraction of about 1.4-2.0 at 630 nm, as an example.

Figure 8:
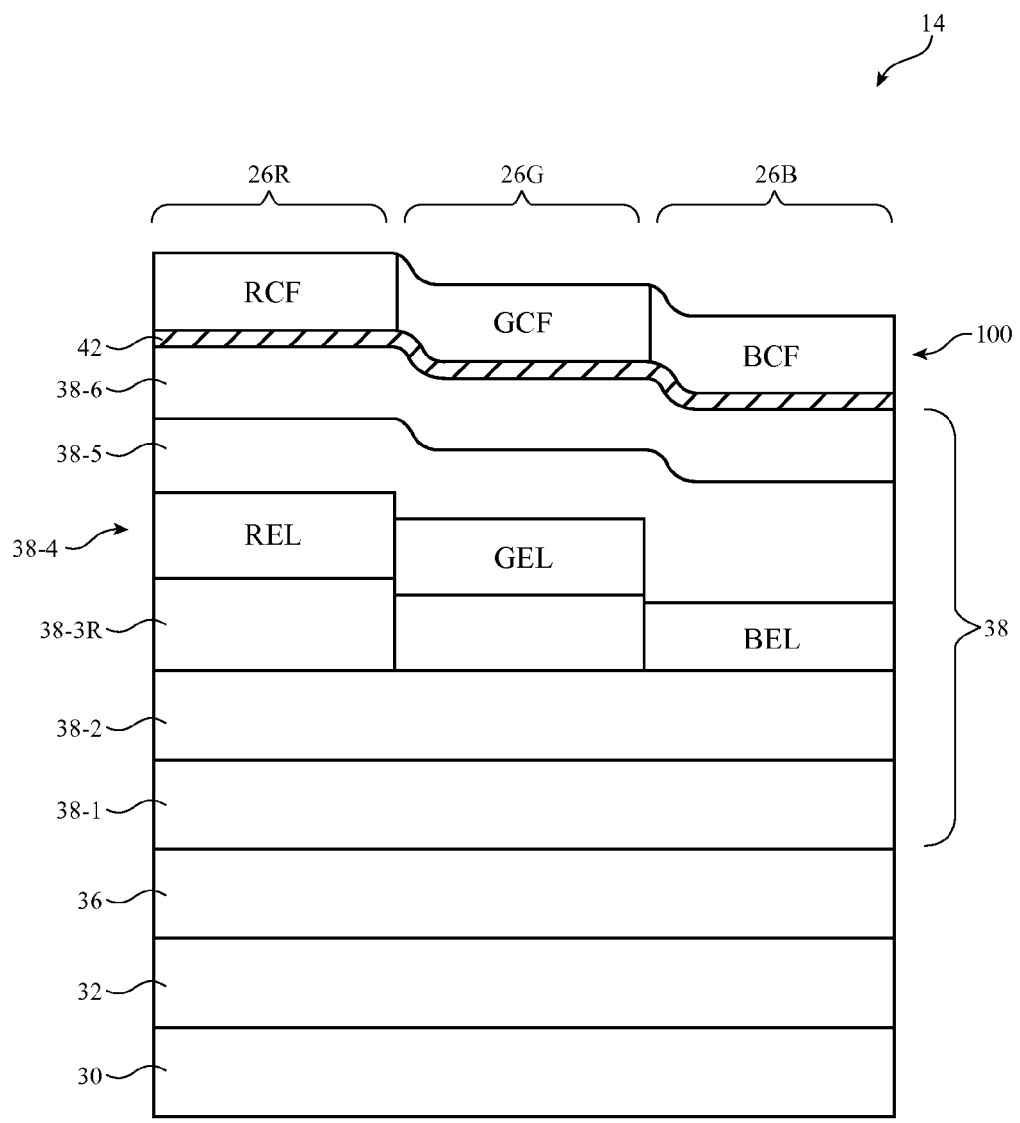
FIG. 8 is a cross-sectional side view of an illustrative organic light-emitting diode display in which red, green, and blue pixels are coated with respective evaporated red, green, and blue color filter layers in accordance with an embodiment.

In the example of FIG. 8, red diode 26R has been provided with an evaporated red color filter layer RCF, green diode 26G has been provided with a green color filter layer GCF (e.g., a color filter that passes spectrum 24G of FIG. 5 while blocking light at shifted wavelengths such as light BS-G), and blue diode 26B has been provided with a blue color filter layer BCF (e.g. a color filter that passes spectrum 24B of FIG. 5 while blocking light at shifted wavelengths such as light BS-B).

The evaporated materials of filters RCF, GCF, and BCF may allow these layers to simultaneously serve as wavelength filters and as a capping layers that provide environmental protection and etalon tuning. The thicknesses of filters RCF, GCF, and BCF may be 50-70 nm or other suitable thicknesses and may be the same or different from each other. In an arrangement of the type shown in FIG. 7, two shadow masks may be used to form the layers of material on cathode 42 (i.e., one mask may be used to form patterned red color filter layer RCF and one mask may be used to form patterned capping layer 102). In an arrangement of the type shown in FIG. 8, three shadow masks may be used (i.e., one mask may be used to form patterned red color filter layer RCF, one mask may be used to form patterned green color filter layer GCF, and one mask may be used to form patterned blue color filter layer BCF). Additional capping layer material (e.g., an additional clear capping layer) can be added below and/or above filters RCF, GCF, and BCF, if desired.

Display 14 may be covered with a circular polarizer to suppress ambient light reflections from anodes 36 or the circular polarizer may be omitted from display 14 (in which case the optical properties of the etalons and color filters formed from the diode structures of display 14 such as the diode structures of FIG. 8 serve to suppress ambient light).

Figure 9:
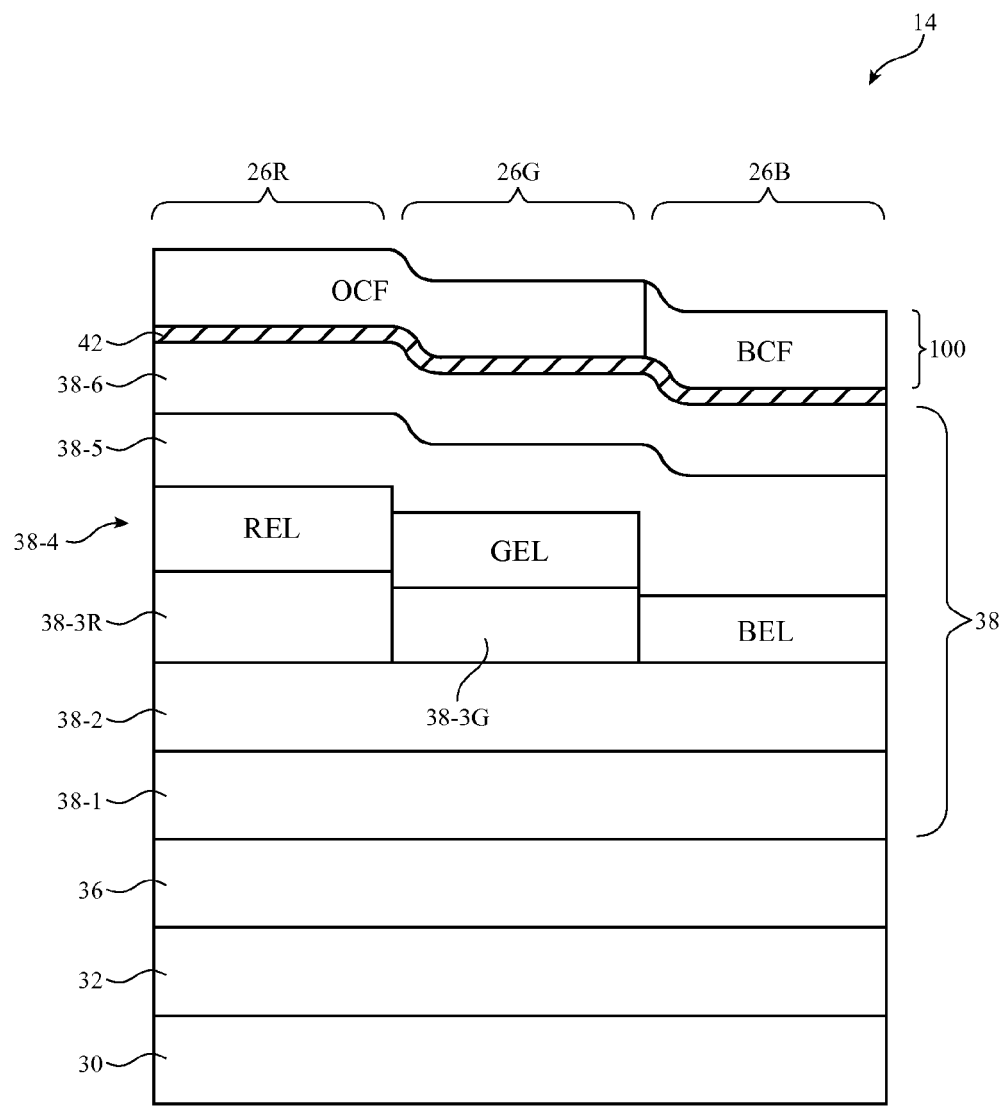
FIG. 9 is a cross-sectional side view of an illustrative organic light-emitting diode display in which red and green pixels are coated with an evaporated orange color filter layer and in which blue pixels are coated with an evaporated blue color filter layer in accordance with an embodiment.

In the example of FIG. 9, red diode 26R and green diode 26G have been coated with an overlapping evaporated orange color filter layer OCF. Orange color filter layer OCF passes red light 24R and green light 24G. Orange color filter layer OCF blocks light at wavelengths of 540 nm to 600 nm, thereby blocking blue-shifted red light from red diode 26R and may absorb blue-shifted green light (light BS-G of FIG. 5). Blue diode 26B has been covered with blue color filter layer BCF that absorbs blue-shifted light BS-B while passing light 24B of FIG. 5. Filter layers OCF and BCF of layer 100 may be formed from evaporated materials that allow these layers to simultaneously serve as wavelength filters and as a capping layer. A first shadow mask may be used when depositing patterned orange color filter layer OCF and a second shadow mask may be used when depositing patterned blue color filter layer BCF.

Figure 10:
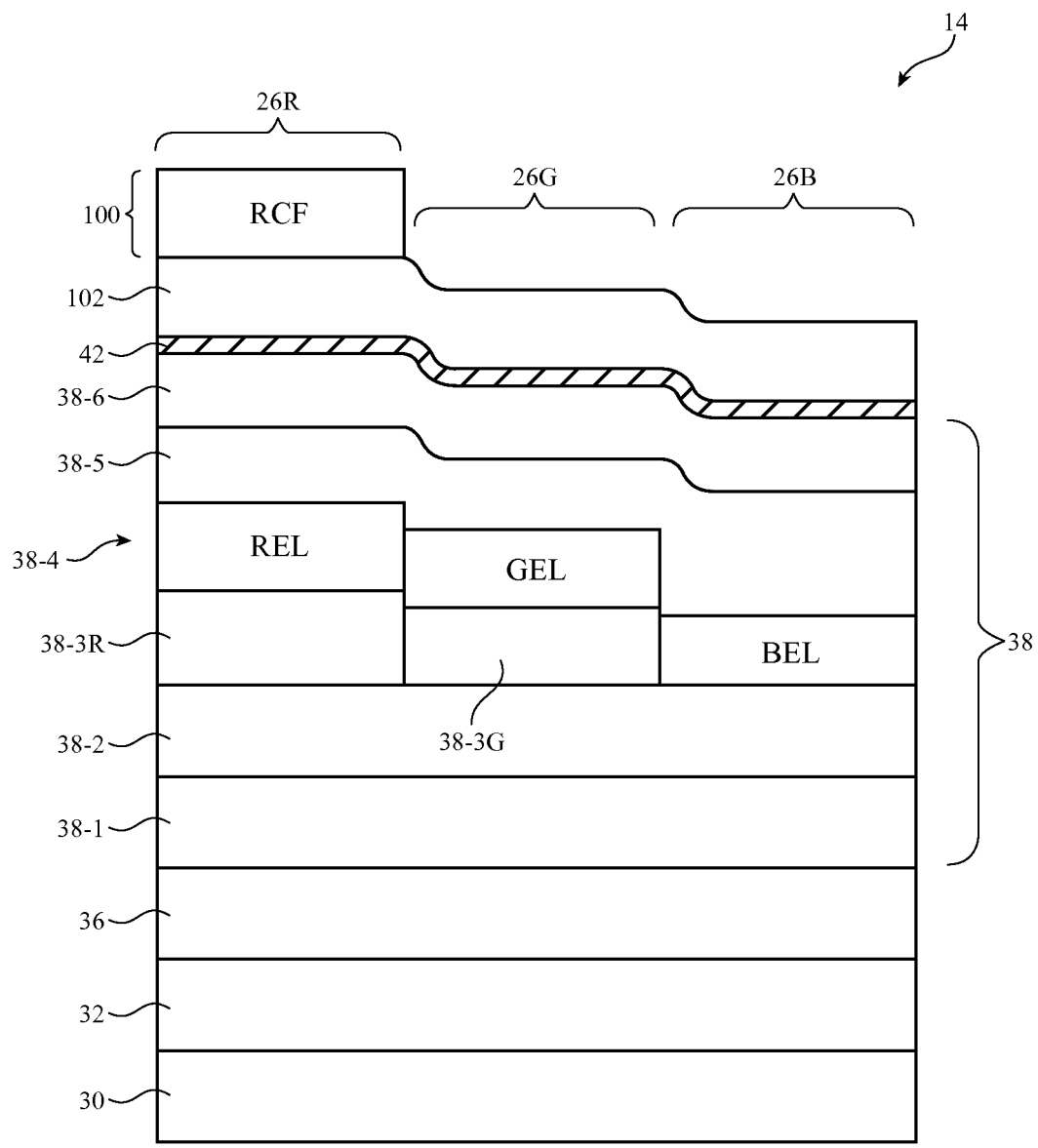
FIG. 10 is a cross-sectional side view of an illustrative organic light-emitting diode display in which red, blue, and green pixels are covered with a capping layer and in which the portion of the capping layer overlapping red pixels is coated with a red color filter layer in accordance with an embodiment.

In the example of FIG. 10, capping layer 102 has been deposited as a blanket film on cathode 42 without using a shadow mask. The thickness of layer 102 may be, for example, 50-70 nm. Red color filter layer 26R may be deposited on layer 102 through a shadow mask (e.g., to a thickness of 150-190 nm or other suitable thickness for satisfactory operation of the red diode etalon). Because only a single shadow mask is used in forming the color filter structures of display 14 in the illustrative configuration of FIG. 10, the mask count for forming display 14 is minimized.

If desired, the number of evaporated color filter layers, the placement of these color filter layers relative to the red, green, and blue diodes, the use of capping layer materials, the order in which layers overlap diodes 26, and the number of shadow masks used for forming these structures can be varied. The illustrative arrangements of FIGS. 7, 8, 9, and 10 are merely examples.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
    a substrate; and
    an array of organic light-emitting diode pixels on the substrate including organic light-emitting diodes of at least first, second, and third colors, wherein the organic light-emitting diodes of the first color have an emissive layer of a first color and a color filter layer of the first color, wherein the organic light-emitting diodes of the second color have an emissive layer of the second color, wherein the organic light-emitting diodes of the first color have a cathode that is interposed between the color filter layer of the first color and the emissive layer of the first color, and wherein the organic light-emitting diodes of the second and third colors are covered with a color filter layer of a fourth color.

2. The display defined in claim 1 wherein the first color is red and wherein the color filter layer of the first color comprises a red color filter layer.

3. The display defined in claim 2 further comprising a clear capping layer on the organic light-emitting diodes of the second color.

4. The display defined in claim 1 wherein the organic light-emitting diodes of the second and third colors are covered with a clear capping layer.

5. The display defined in claim 1 wherein the first color is blue, wherein the emissive layer of the light-emitting diodes of the first color comprises a blue emissive layer, wherein the color filter layer of the fourth color comprises an orange color filter layer, wherein the second color is red, and wherein the third color is green.

6. The display defined in claim 1 further comprising a clear capping layer that covers the organic light-emitting diodes of the first, second, and third colors.

7. The display defined in claim 1 wherein the color filter layer of the first color includes a material selected from the group consisting of: DCM, DCM2, PR254, and PR256.

8. An organic light-emitting diode display with pixels of first, second, and third colors, comprising:
    a substrate;
    thin-film transistor circuitry on the substrate;
    a organic light-emitting diode layer on the thin-film transistor circuitry that forms first, second, and third diodes respectively for the pixels of the first, second, and third colors, wherein the first, second, and third diodes include emissive material;
    a transparent conductive layer that covers the organic light-emitting diode layer; and
    at least one color filter layer of the first color that overlaps the first diodes, wherein the transparent conductive layer is interposed between the at least one color filter layer and the emissive material of the first diodes and wherein the at least one color filter layer forms a capping layer for the first diodes.

9. The organic light-emitting diode display defined in claim 8 wherein the first color comprises red, the second color comprises green, and the third color comprises blue and wherein the at least one color filter layer comprises a red color filter layer that overlaps the first diodes without overlapping the second and third diodes.

10. An organic light-emitting diode display with pixels of first, second, and third colors, comprising:
    a substrate;
    thin-film transistor circuitry on the substrate;
    a organic light-emitting diode layer on the thin-film transistor circuitry that forms first, second, and third diodes respectively for the pixels of the first, second, and third colors, wherein the first, second, and third diodes include emissive material;
    a transparent conductive layer that covers the organic light-emitting diode layer;
    at least one color filter layer of the first color that overlaps the first diodes, wherein the transparent conductive layer is interposed between the at least one color filter layer and the emissive material of the first diodes; and
    a clear capping layer that overlaps the second and third diodes without overlapping the first diodes.

11. An organic light-emitting diode display, comprising:
    a substrate; and
    red light-emitting diodes, green light-emitting diodes, and blue light-emitting diodes formed on the substrate, wherein the red light-emitting diodes include an anode, a red emissive layer, red color filter layer, and a cathode between the red emissive layer and the red color filter layer, and wherein the green light-emitting diodes and the blue light-emitting diodes do not include color filter layers.

12. The organic light-emitting diode display defined in claim 11 wherein the red color filter layer comprises a thermally evaporable material that serves as a capping layer for the red light-emitting diodes and that does not overlap the blue and green light-emitting diodes.

13. The organic light-emitting diode display defined in claim 11 wherein the red color filter layer comprises a thermally evaporable red color filter layer, the organic light-emitting diode display further comprising a capping layer, wherein a first portion of the capping layer overlaps the blue and green light-emitting diodes and wherein a second portion of the capping layer is interposed between the red color filter layer and the cathodes of the red light-emitting diodes.

* * * * *